(12) United States Patent
Sridharan et al.

(10) Patent No.: US 8,760,932 B2
(45) Date of Patent: Jun. 24, 2014

(54) DETERMINATION OF MEMORY READ REFERENCE AND PROGRAMMING VOLTAGES

(75) Inventors: Arvind Sridharan, Longmont, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 179 days.

(21) Appl. No.: 13/275,497

(22) Filed: Oct. 18, 2011

(65) Prior Publication Data

US 2013/0094289 A1 Apr. 18, 2013

(51) Int. Cl.
*G11C 11/34* (2006.01)
*G11C 16/04* (2006.01)

(52) U.S. Cl.
USPC ............. 365/185.24; 365/181.18; 365/185.03

(58) Field of Classification Search
USPC ........ 365/185.03, 206, 185.24, 200; 714/811, 714/817
See application file for complete search history.

(56) References Cited

U.S. PATENT DOCUMENTS

| | | | |
|---|---|---|---|
| 6,044,019 A * | 3/2000 | Cernea et al. ............. | 365/185.21 |
| 6,522,580 B2 | 2/2003 | Chen et al. | |
| 7,023,735 B2 | 4/2006 | Ban et al. | |
| 7,372,731 B2 | 5/2008 | Ban | |
| 7,558,109 B2 | 7/2009 | Brandman et al. | |
| 7,593,259 B2 | 9/2009 | Kim | |
| 7,663,914 B2 | 2/2010 | Lee | |
| 7,890,818 B2 | 2/2011 | Kong et al. | |
| 7,903,468 B2 | 3/2011 | Litsyn et al. | |
| 7,944,757 B2 | 5/2011 | Moschiano et al. | |
| 7,945,825 B2 | 5/2011 | Cohen et al. | |
| 7,974,132 B2 | 7/2011 | Cornwell et al. | |
| 7,990,764 B2 | 8/2011 | Alrod et al. | |
| 8,000,135 B1 | 8/2011 | Perlmutter et al. | |
| 8,000,141 B1 | 8/2011 | Shalvi et al. | |
| 8,077,520 B1 | 12/2011 | Yang et al. | |
| 8,289,781 B2 | 10/2012 | Litsyn et al. | |
| 8,331,169 B1 | 12/2012 | Yang et al. | |
| 8,345,477 B1 | 1/2013 | Yang | |
| 8,351,258 B1 | 1/2013 | Yang et al. | |
| 8,363,501 B1 * | 1/2013 | Ramamoorthy et al. | 365/210.11 |
| 8,369,141 B2 | 2/2013 | Sommer et al. | |

(Continued)

FOREIGN PATENT DOCUMENTS

| | | |
|---|---|---|
| WO | WO2008078314 | 7/2008 |
| WO | WO2011008367 | 1/2011 |
| WO | WO2011094454 | 8/2011 |

OTHER PUBLICATIONS

Mielke et al., "Bit Error Rate in NAND Flash Memories", 46th Annual International Reliability Physics Symposium, Phoenix, 2008, pp. 9-19.

(Continued)

*Primary Examiner* — Son Dinh
*Assistant Examiner* — Uyen B Tran
(74) *Attorney, Agent, or Firm* — Hollingsworth Davis, LLC

(57) ABSTRACT

Symmetrical or asymmetrical noise distributions for voltages corresponding to symbols that can be stored in multi-level memory cells (MLCs) of a memory device are used to determine read reference and/or programming voltages. The read reference voltages and/or programming voltages for the MLCs are jointly determined using the symmetrical distributions and a maximum likelihood estimation (MLE) and/or by determining at least one of the read reference voltages and the programming voltages using the asymmetrical distributions.

17 Claims, 8 Drawing Sheets

(56) References Cited

U.S. PATENT DOCUMENTS

| | | |
|---|---|---|
| 8,498,152 B2 | 7/2013 | Alrod et al. |
| 8,531,888 B2 | 9/2013 | Chilappagari et al. |
| 2006/0028875 A1 | 2/2006 | Avraham et al. |
| 2008/0002464 A1* | 1/2008 | Maayan ..................... 365/185.2 |
| 2009/0287975 A1 | 11/2009 | Kim et al. |
| 2010/0034019 A1* | 2/2010 | Kang et al. ............... 365/185.03 |
| 2010/0118608 A1 | 5/2010 | Song et al. |
| 2010/0199149 A1 | 8/2010 | Weingarten et al. |
| 2011/0038212 A1 | 2/2011 | Uchikawa et al. |
| 2011/0066902 A1 | 3/2011 | Sharon et al. |
| 2011/0066922 A1* | 3/2011 | Wezelenburg et al. ....... 714/773 |
| 2011/0069521 A1 | 3/2011 | Elfadel et al. |
| 2011/0141827 A1 | 6/2011 | Mozak et al. |
| 2011/0182118 A1 | 7/2011 | Litsyn et al. |
| 2011/0216598 A1 | 9/2011 | Kim et al. |

OTHER PUBLICATIONS

U.S. Appl. No. 13/275,418, filed Oct. 18, 2011, Patapoutian et al.
Yaakobi et al., "Error Characterization and Coding Schemes for Flash Memories", GLOBECOM Workshops, 2010, IEEE, 5 pages.
U.S. Appl. No. 13/275,675, filed Oct. 18, 2011, Sridharan et al.
U.S. Appl. No. 13/275,598, filed Oct. 18, 2011, Sridharan et al.
File History for U.S. Appl. No. 13/275,418.
File History for U.S. Appl. No. 13/275,598.
File History for U.S. Appl. No. 13/275,675.

\* cited by examiner

DETERMINATION OF MEMORY READ REFERENCE AND PROGRAMMING VOLTAGES

SUMMARY

Various embodiments described in this disclosure are generally directed to methods and devices for determining read reference and/or programming voltages used to read and/or program memory cells such as non-volatile flash memory cells.

Some embodiments involve methods of operating a memory device. Symmetrical or asymmetrical noise distributions for voltages corresponding to symbols that can be stored in multi-level memory cells (MLCs) of the memory device are determined. At least one of read reference voltages and programming voltages for the MLCs are determined by 1) jointly determining the read reference voltages and programming voltages using the symmetrical distributions and a maximum likelihood estimation (MLE) or 2) determining at least one of the read reference voltages and the programming voltages using the asymmetrical distributions. The MLCs are programmed using the programming voltages and/or are read using the read reference voltages.

A method of operating a memory device involves determining noise distributions for voltages corresponding to symbols that can be stored in multi-level memory cells (MLCs) of the memory device. Each noise distribution comprising a first noise distribution for voltages above a target signal value and a second noise distribution, different from the first noise distribution, for voltages below the target signal value. At least one of read reference voltages and programming voltages for the MLCs are determined using the first and second noise distributions. The MLCs are programmed and/or read using the programming voltages and read reference voltages, respectively.

According to some embodiments an apparatus includes a controller capable of being coupled to a memory device. The controller is configured to determine symmetrical or asymmetrical noise distributions for symbols corresponding to voltage levels capable of being stored in multi-level memory cells (MLCs) of the memory device. The controller jointly determines read reference voltages and programming voltages for the MLCs using the symmetrical noise distributions and a maximum likelihood estimation or determines at least one of the read reference voltages and the programming voltages using the symmetrical or the asymmetrical distributions.

These and other features can be understood in view of the following detailed discussion and the accompanying drawings.

DETAILED DESCRIPTION

Figure 1:
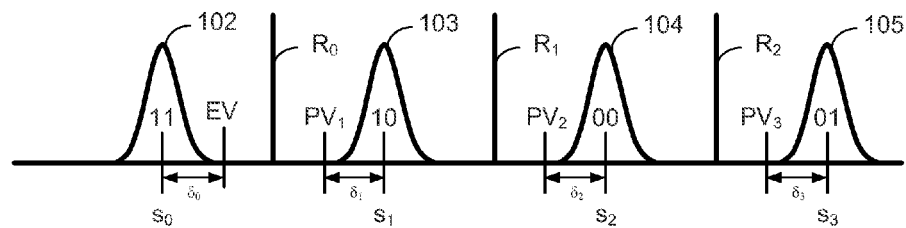
FIG. 1 illustrates an example of how data is stored in a two-bit per cell multilevel memory cell device.

Non-volatile memory devices are capable of retaining stored data for relatively long periods of time, even in the absence of external power. Non-volatile solid state memory includes flash memory which programs data into memory cells by applying a voltage causing charge to be stored on a floating gate of a transistor. The data can be later read from the memory cell by sensing the voltage of the transistor and comparing the sensed voltage to a read reference voltage. Flash memory technologies include NOR flash, NAND flash, 2D NAND flash 3D NAND flash (also called vertical NAND (VNAND)) and various other technology types.

Charge stored on a floating gate is subject to charge leakage over time (retention effects), and to charge disturbances caused by local electrical signals (disturb effects). Either of these phenomena can change the voltage stored in the transistor memory cell and cause errors in the data. The number of program/erase cycles experienced by a memory cell may make the memory cell more susceptible to charge leakage and/or disturb effects.

The errors in data may be decreased by modifying the programming voltages used to store the data and/or by modifying the read reference voltages used to read data stored in the memory cells. Embodiments described in this disclosure involve methods and systems for determining appropriate read reference voltages and/or programming voltages for memory devices. In some implementations, the read reference voltages and/or programming voltages are jointly determined using a maximum likelihood estimation process. In some implementations, the read reference voltages and/or programming voltages are determined using noise distributions for one or more symbols that are asymmetrical with respect to a voltage value, e.g., a target signal level. For multipage implementations, the read reference voltages and/or programming voltages may be determined so that the bit error rate of the most significant bit pages is about equal to the bit error rate of the least significant bit pages.

Memory devices may comprise single-level memory cells or multi-level memory cells. Single level cell (SLC) memory uses memory cells that store one bit of data per cell. Data is read from the SLC by sensing the voltage of the memory cell and comparing the sensed voltage to a reference voltage. If the sensed voltage is greater than the reference voltage, it is determined that the bit is in a first state, e.g., the "0" state, and if the sensed voltage is less than the reference voltage, it is determined that the bit is in a second state, e.g., the "1" state. In multi-level cell (MLC) memory, the memory cells can be programmed to store two or more bits of information. For example, a two bit MLC is capable of storing four two bit symbols, 00, 01, 10, 11, each symbol corresponding to a different voltage level stored in the memory cell.

In general, a memory cell may be programmed to a number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc. While specific examples below are illustrated as two-bit-per-cell memory, it is not intended that the concepts and embodiments described herein be solely limited to this type of memory. For example, MLC may refer to any number of multiple bits per cell.

An example of how data is stored a two-bit per cell MLC device is shown in FIG. 1. When a memory cell is programmed, the cell is charged until the stored value exceeds a program-verify voltage, $PV_1$, $PV_2$, $PV_3$. When the memory cells are erased, corresponding to the 11 state, the memory cells are confirmed to be below an erase verify voltage, EV.

Assuming a Gaussian distribution, when the voltages are read from the memory cells, the sensed voltages of memory cells of a page (or other unit) of the MLC memory device may be distributed around target signal levels, $s_0$, $s_1$, $s_2$, and $s_3$ and fall within voltage distributions 102-105, respectively. Voltage distribution 102 includes the voltages stored in the memory cells corresponding to symbol 11, voltage distribution 103 includes the voltages stored in the memory cells corresponding to symbol 10, voltage distribution 104 includes the voltages stored in the memory cells corresponding to symbol 00, and voltage distribution 105 includes the voltages stored in the memory cells corresponding to symbol 01. Voltages $R_1$-$R_3$ are read reference voltages that are used to determine which symbols are stored in the cells. For example, after the voltage corresponding to the symbol 10 is applied to a cell during a program operation, the symbol 10 is said to be programmed into the cell. At a later time, the voltage of the cell is sensed and the sensed voltage is compared to read references voltages to read the symbol stored in the cell. During a read operation, the sensed voltage may first be compared to $R_1$. If the comparison to $R_1$ determines that the sensed voltage is less than $R_1$, then the symbol stored in the cell is either 11 or 10. The sensed voltage may next be compared to $R_0$. If the sensed voltage is greater $R_0$, then the symbol stored in the cell is 10. However, if the sensed voltage for this cell deviates from the voltage values associated with the symbol 10, e.g., the sensed voltage for the cell is instead greater than $R_1$ or less than $R_0$, then a bit error occurs when the cell is read.

Generally, a variety of error correction code (ECC) algorithms are known that can correct a known number of bit errors for a predefined word size and number of ECC bits. Memory systems may use multiple levels of error coding (e.g., inner and outer coding) to improve overall error correction performance. A bit error rate (BER) metric is used to gauge the performance of the memory in general. In some implementations, the sensed voltages of the memory cells are compared to reference voltages in addition to the primary read reference voltages $R_0$, $R_1$, and $R_2$ shown in FIG. 1. Comparison to the additional reference voltages may be used to generate soft information. Soft information can be used by some types of decoders, e.g., LDPC decoders, and provides a measure on the reliability of a bit being a "0" or a "1". The values obtained using the additional read reference voltages are used to develop a log likelihood ratio (LLR) which represents the bit read from the memory cell along with reliability information. The LLR can be developed either analytically (based on a noise distribution) or more generally by a look up table.

The memory cells of a memory device can be grouped into data units referred to herein as data pages or blocks. A data page can correspond to a group of memory cells that are read at substantially the same time, for example. A group of flash memory pages that are erased at substantially the same time are referred to herein as a block or erasure unit. Flash memory cells are programmed in units of pages and once programmed, the pages are not re-programmed until after the block of pages is erased. Garbage collection operations are performed on the blocks of pages, wherein the blocks are erased after active data stored in each block is moved to another location. Thus, each memory cell of the memory device undergoes numerous program/erase (PE) cycles during the lifetime of the memory cell. As previously mentioned, the number of PE cycles experienced by a memory cell affects the cell characteristics.

Charge stored in a memory cell may need to be retained for months or years, e.g., longer than 10 years, even in the absence of power. Even a low charge leakage rate from the memory cell can cause data errors to occur if the retention time, τ, is substantial. Disturb effects, ρ, may occur when the charge stored on the floating gate of a transistor memory cell is disturbed unintentionally by local electrical signals present when other memory cells are erased, written to (programmed), and/or read. Deviations between programmed voltages and sensed voltages are considered noise and can be modeled using noise statistics. The noise associated with the data in a page may be a function of PE, τ, ρ.

The target signal levels, PV/EV voltages and/or the read reference voltages, i.e., both the primary reference voltages and secondary read reference voltages (used to acquire soft information) may be adjusted according to the noise statistics to prevent the number of errors from increasing and affecting the reliability of a memory device. Determining the noise statistics for the memory cells and/or modification of the PV/EV voltages and the read reference voltages may be performed periodically, at predetermined times, or during times that provide a good opportunity for determining the statistics and/or making the modifications.

As shown in FIG. 1, the separation $\delta_i$ between voltages $s_i$ and $PV_i$ may be written:

$\delta_i = s_i - PV_i$, wherein i=1, 2, 3

In other words, $\delta_i$, is the separation between the target signal level $s_i$ and the program verify level $PV_i$. Furthermore, $\delta_i$ is a function of the PE cycle, retention time, and read disturb, i.e. $\delta_i = \delta_i (PE, \tau, \rho)$. In general the larger the noise or the leakage probability, the larger is $\delta_i$. This dependence can be measured but varies from one manufacturing process to another and from one technology to another. Note that once $\delta_i$ is determined, $PV_i$ and $s_i$ are interchangeable. Similarly, in the erase state, $s_0 = EV - \delta_0$, where $\delta_0 = \delta_0(PE, \tau, \rho)$.

As discussed herein, full-sequence programming implies each physical page o memory cells holds a single user page. Multipage programming implies that each physical page of the memory cells holds at least two user pages. For multipage programming of two bit memory devices, the pages corresponding to a physical page may be referred to as LSB and MSB pages.

In some cases, the programming and/or read reference voltages can adjusted for optimal operation either for the whole physical page, i.e. over all 4 signals of the MLCs. This type of implementation may be useful in full-sequence programming. In some cases, the programming and/or read reference voltages can be adjusted for optimal operation for LSB page and MSB pages separately. In some case, determining optimal programming and/or read reference voltages involves determining programming and/or read reference voltages that produce a substantially equal error rate of LSB and MSB pages. This type of implementation may be useful in multipage programming.

Figure 2:
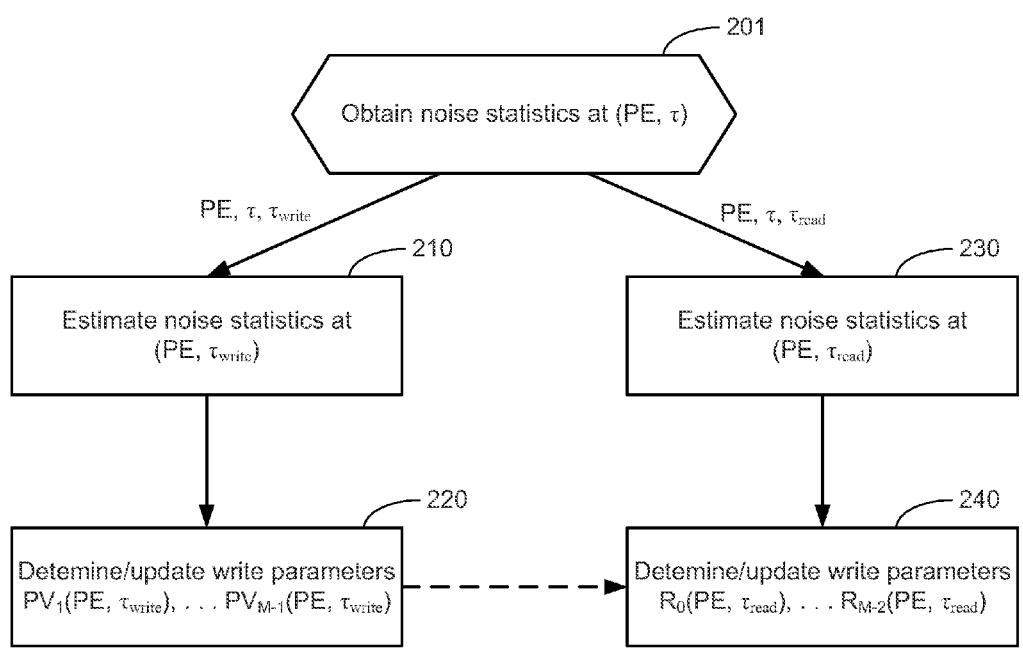
FIG. 2 illustrates a method to determine the target signal levels, $s_i$, program verify voltages, $PV_i$, and read reference voltages, $R_i$ in accordance with embodiments described herein.

FIG. 2 illustrates a general method to determine the target signal levels, $s_i$, program verify voltages, $PV_i$, and/or read reference voltages, $R_i$. Note that the target signal levels, $s_i$, and program verify voltages, $PV_i$, are collectively referred to herein as programming voltages. As previously discussed, the target signal levels and program verify voltages are separated by offset, $\delta_i$. Thus assuming the offset, $\delta_i$, is known, then the program verify voltages, $PV_i$, can be determined from the target signal levels, and vice versa. As shown in block 201, noise statistics are first obtained. For example, the noise statistics can comprise error information for some arbitrary PE cycle number, retention time, $\tau$, and possibly one or more additional parameters such as read disturb, type of page, e.g., MSB or LSB, page number, and/or other parameters. In some implementations, the noise statistics may be obtained through test mode access to the memory. However, test mode access is not always possible. In some implementations, the noise statistics can be inferred from the measured bit error rate. The bit error rate may be determined during the decoding process, for example. For example, for Gaussian noise, if the distance between the sensed voltage and the read reference voltage is a known distance, $\delta_{Ri}$, then the relationship between the noise distribution standard deviation and the bit error rate, p, is $p_i = Q(\delta_{Ri}/\sigma_i)$, wherein Q(.) is the Gaussian tail function:

$$Q(y) = \frac{1}{\sqrt{2\pi}} \int_y^\infty e^{-\frac{x^2}{2}} dx.$$

Furthermore, it will be appreciated that the noise distribution of the memory cell may be obtained through a process that uses bucket classification of errors as described in commonly owned and concurrently filed U.S. patent application Ser. No. 13/275,418, which is incorporated herein by reference in its entirety.

Noise statistics may be obtained 201 at some arbitrary retention time, $\tau_a$. The noise statistics may be based on the bit error rate (BER) and can be a function of the retention time, number of PE cycles, read disturb events, temperature of the device, page number, page type, and/or other such parameters.

Noise statistics are estimated 210 so that the BER for retention interval, $\tau_{write}$, such as a maximum retention interval $\tau_{max}$, is acceptable or optimal. The noise statistic estimations account for noise factors that may affect the data stored in the cells during the interval $\tau_{write}$ which is the interval of time between the time that data is written to the cells and the time that the data is read from the cells. In various embodiments, the noise statistics can be estimated for a retention interval $\tau_{write}$ to account for a larger number of PE cycles, disturb factors and/or other noise factors that would occur during the retention interval $\tau_{write}$. Additional factors such as page type and/or page number may be factored in to the noise estimation. In some cases, the noise statistics estimated for interval $\tau_{write}$ can be based on empirical data, e.g., characterization of the device parameters at any previous retention time $\tau$. In some cases, the noise statistics estimated for retention interval $\tau_{write}$ can be based on a model that provides an estimation of the extent to which PE, $\tau$, $\rho$ and/or other factors would alter the charge stored in the memory cells. In some cases, the noise statistics can be based on both the empirical data and the model.

The optimal programming voltages that provide acceptable or minimal BER for retention interval $\tau_{write}$ can be determined or updated 220 based on the estimated noise statistics. As discussed in more detail below, the estimated noise statistics may be associated with distributions of various types, e.g., Gaussian, exponential, triangular, etc., and may be symmetrical or asymmetrical. In some cases, the highest program verify level $PV_3$ (when M=4) as well as erasure verify (EV) may be relatively established values with less room for adjustment than the middle PV values. Thus, the adjustment across the PV values may not be a constant amount, and $PV_1$ and/or $PV_2$ may be adjusted by an amount that is relatively larger than the amount of adjustment used for either $PV_3$ or EV.

In a process similar to the one discussed in connection with the write operation of FIG. 2, the noise statistics for determining read reference voltages are estimated at block 230. As before, whereas noise statistics may be initially obtained for arbitrary time interval, $\tau_a$, the noise statistics may be estimated for a subsequent time interval, $\tau_{read}$. Adjusting the read reference voltages, $R_i$ using the noise statistics estimated for interval $\tau_{read}$ could improve the BER of a subsequent read operation because the adjusted read reference voltages compensate for changes in the charge stored in the cells due to charge leakage, disturb effects and/or other effects. As previously mentioned, the noise statistics may be estimated based on empirical data (noise parameters obtained at any time) and/or on modeling. One or more of the read reference voltages, $R_i$ are adjusted 240 using the noise statistics. The process of adjusting the read reference voltages may optionally be based on the programming voltages, e.g., program verify levels, $PV_i$ and/or target signal levels, $s_i$, determined at block 220.

For example, in some implementations, noise statistics may be determined by reading, at any opportune time, e.g., during a garbage collection operation, training data stored in the memory cells. The training data may be obtained from a known data pattern or may be obtained from ECC converged data. In some cases, the training data may have a lower code rate to increase the likelihood of convergence. The noise statistics obtained using the training data may be used to adjust the read and/or programming voltages for subsequent read or write operations.

In some cases, only the operation to determine optimal read reference voltages is performed. In these cases, the left hand branch of FIG. 2 may be ignored. In other cases, only the operation to determine optimal program verify voltages is performed. In these cases, the right hand branch of FIG. 2 may be ignored.

In some embodiments, the programming voltages and/or read reference voltages may be adjusted using a maximum likelihood estimation as discussed in more detail below. Additionally or alternatively, in some embodiments, the noise distributions used in determining $PV_i$, and/or $R_i$ may be asymmetrical with respect to the target signal levels, $s_0$, $s_1$, $s_2$, $s_3$, associated with the symbols. Asymmetrical Gaussian, triangular, and exponential noise distributions are discussed below, however, it will be appreciated that any noise distribution may be used in conjunction with the maximum likelihood estimation and/or any asymmetrical noise distribution may be similarly implemented.

Figure 3:
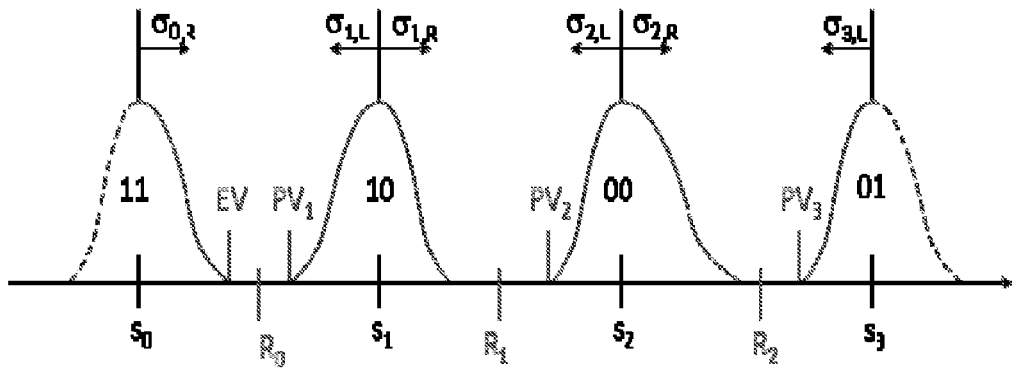
FIG. 3 illustrates an embodiment wherein the noise associated with at least one symbol is estimated using an asymmetrical Gaussian distribution in accordance with embodiments described herein.

FIG. 3 illustrates an embodiment wherein the noise associated with at least one symbol is estimated as an asymmetrical Gaussian distribution. In the example provided in FIG. 3, the noise associated with each symbol is Gaussian and is parameterized by voltage, $s_i$, and standard deviations $\sigma_{iL}$ and/or $\sigma_{iR}$. As discussed above, different noise mechanisms may cause the voltage level stored in the memory cells to drop (charge loss) and/or rise (over programming, e.g., due to disturb effects) over the nominal voltage for the symbol, $s_i$. The noise may be optimally estimated using a distribution having different parameters above and below the target signal level. In this case, the noise is estimated by using Gaussian distributions having two different standard deviations, $\sigma_{iL}$ and $\sigma_{iR}$, where $\sigma_{iL} \neq \sigma_{iR}$. Note that in various implementations, none of $\sigma_{i,X}$ wherein I=0, 1, 2, 3 and X=R or L may be equal to one another, or some of the $\sigma_{i,X}$ may be equal, e.g., $\sigma_{1,R} = \sigma_{1,R}$, etc.

As indicated in FIG. 3, a Gaussian with $\sigma_{iL}$ is used to estimate the noise associated with the most significant bit (MSB) for the ith symbol and a Gaussian with $\sigma_{iR}$ is used to estimate the noise associated with the least significant bit (LSB) of the ith symbol. Although FIG. 3 shows asymmetrical Gaussian distribution for a two bit (4 symbol levels) MLC, it will be appreciated that symbols having more or fewer bits may be implemented. Note that for each symbol, even though the voltage levels on either side of the Gaussian function for the symbol can either drop or increase in voltage, in some cases, only changes in the left side voltage are of interest for program verify voltage determination. The Gaussian noise model is readily applicable for memory such as flash memory.

Note that in general for asymmetrical noise distributions, the area of the left side of the ith distribution is $a_i$ and the area of the right side of the ith distribution is $1-a_i$. The examples provided below involve the case where $a_i=\frac{1}{2}$ for all symbols. These examples are provided for illustration and do not limit the scope of the approaches discussed herein. It will be appreciated that the approaches exemplified by the illustrative examples may also be applied to the general case.

Figure 4:
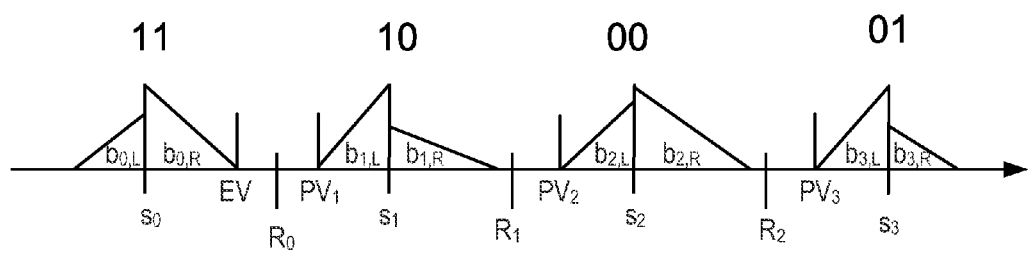
FIG. 4 illustrates an embodiment wherein the noise associated with at least one symbol is estimated using an asymmetrical triangular distribution in accordance with embodiments described herein.

FIG. 4 illustrates asymmetrical noise distributions based on triangular noise distribution. In these embodiments, the noise associated with each symbol is modeled by an asymmetrical triangular distribution. The asymmetrical triangular distribution may be characterized by the base of the triangle, b. As illustrated in FIG. 4, $b_{i,L}$ and $b_{i,R}$ provide the noise distribution characteristics associated with the ith symbol. In this case, $b_a$ characterizes the triangular noise distribution of the MSB and $b_{iR}$ characterizes the triangular nose distribution of the LSB. Note that $b_{i,L}$ may or may not equal $b_{iR}$. The asymmetrical triangular model can be useful, for example, when the signal quality from a read operation decreases linearly and wherein the signal quality of the MSB has different characteristics from the signal quality of the LSB.

Figure 5:
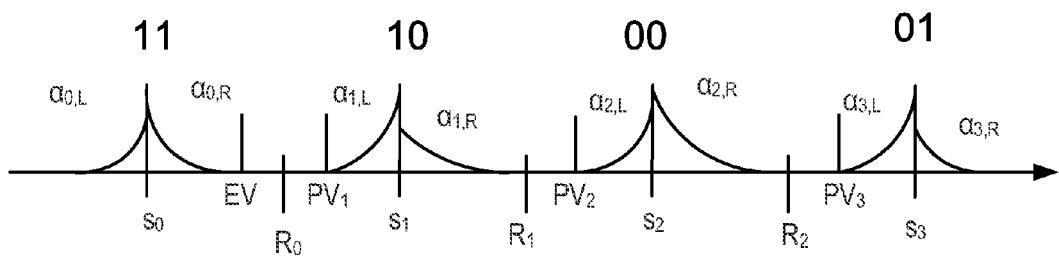
FIG. 5 illustrates an embodiment wherein the noise associated with at least one symbol is estimated using an asymmetrical exponential distribution in accordance with embodiments described herein.

In some implementations, the noise associated with each symbol is estimated using an asymmetrical exponential distributions $v = \beta_{i,X} e^{-\alpha_{i,X}}$, where the subscripts of $\alpha$, i and X are i=0, 1, 2, 3 and X=L and R. The noise for each symbol is estimated as exponential distributions characterized by exponential constants $-\alpha_{i,L}$ and $-\alpha_{i,R}$, where $\alpha_{i,L}$ may or may not be equal to $-\alpha_{i,R}$. Asymmetrical exponential noise distributions for a two bit memory cell are illustrated in FIG. 5. This model arises when the signal quality is estimated to decrease exponentially and the LSB and MSB distributions have different noise characteristics.

In the discussion herein, the following notation is generally maintained: $R_i$ is used for the ith read reference voltage and $s_i$ is used for the desired signal level. As previously noted, the desired signal level, $s_i$ and the program verify level, $PV_i$, are related by $PV_i = s_i - \delta_i$ wherein i=1, 2, 3, and for the erase state, $EV = s_0 + \delta_0$. Thus, for any particular manufacturing process, $\delta_i$ is known, so that once $s_i$ is determined, $PV_i$ can also be determined.

As previously discussed, in multipage programming, a single memory cell stores information from multiple pages, one bit from each page. For example in a 2 bit MLC memory, the LSB and MSB of a symbol level are associated with different pages—an LSB page and MSB page, respectively. In some implementations, multipage programming reference voltages are chosen so that the bit error rate (BER) of each page has a predetermined low BER, e.g., a minimal BER. In some implementation, the BER is selected under the constraint that all pages have the same BER or about the same BER. For example, in some cases, for a 2 bit MLC memory (four different levels) the read reference voltages, $R_0$, $R_1$ and $R_2$ and signal levels, $s_1$ and $s_2$, may be determined to minimize the LSB and MSB error probabilities under the constraint that the LSB and MSB have the same or about the same error rate. The reference voltage choices also depend on the noise distribution used for the LSB and MSB pages.

Figure 6A:
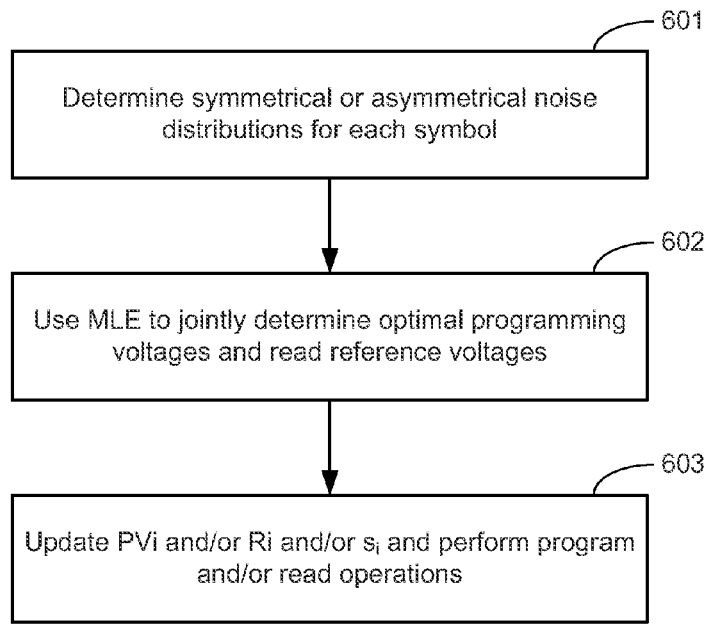
FIG. 6A is a flow diagram illustrating a process of jointly determining optimal signal levels, $s_i$, read reference voltages, $R_i$, and/or program verify voltages $PV_i$, by applying MLE in accordance with various embodiments.

Maximum likelihood estimation can be used to determine optimal programming voltages and read reference voltages for MLC memory devices. FIG. 6A is a flow diagram illustrating a process of jointly determining optimal programming voltages and read reference voltages, $R_i$, by applying MLE.

In some implementations, MLE can be used to jointly determine optimal signal levels and/or read reference voltages. FIG. 6A is a flow diagram illustrating a process of determining optimal programming voltages, $s_i$ and/or $PV_i$, and/or read reference voltages, $R_i$, by applying MLE to symmetrical or asymmetrical noise distributions. In some implementations, $s_i$, $R_i$, and/or $PV_i$ may be jointly determined so that the BER of the LSB pages is about equal to the BER of the MSB pages. In some implementations, $s_i$, $R_i$, and/or $PV_i$ may be jointly determined to achieve optimal average symbol error probability, e.g. to minimize the average symbol error probability. The noise distributions for the symbols can be estimated 601 from empirical data and/or from modeling. In some cases, the noise distributions are initially based on empirical characterization data obtained from the memory when the memory is new. The initial noise distributions for the memory may be adjusted over time to account for increasing PE cycles, retention time, $\tau$, and/or disturb effects, $\rho$.

These adjusted noise distributions are used to update $s_i$, $R_i$, and/or $PV_i$. Using MLE, $s_i$, $R_i$, and/or $PV_i$ are jointly determined 602. One or both of a read operation and a program operation can be performed 603 using the adjusted $s_i$, $R_i$, and/or $PV_i$ jointly determined using MLE.

Figure 6B:
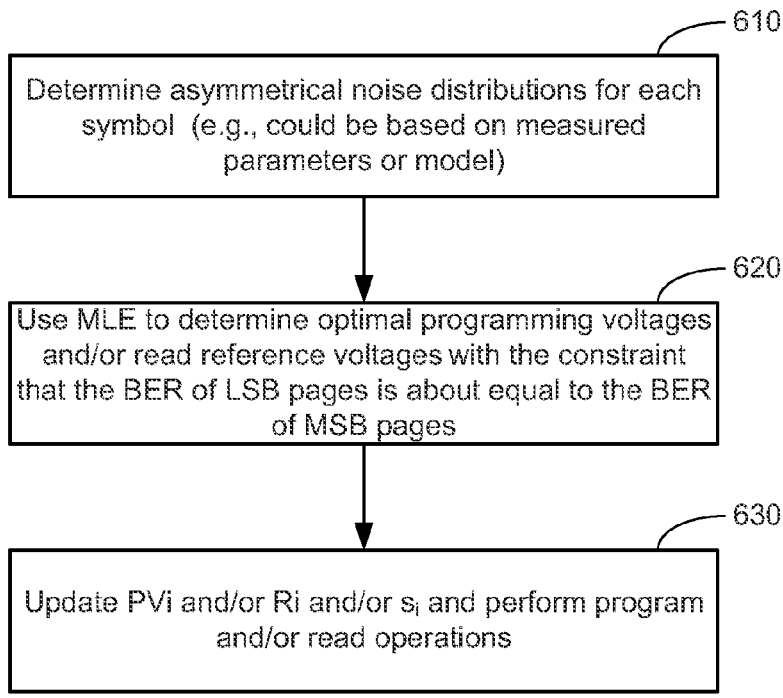
FIG. 6B is a flow diagram illustrating a process of determining optimal signal levels, $s_i$, read reference voltages, $R_i$, and/or program verify voltages $PV_i$, by applying MLE to asymmetrical noise distributions to achieve about equal bit error rates for most significant bit and least significant bit pages in accordance with various embodiments.

FIG. 6B is a flow diagram illustrating a process of determining optimal programming voltages, $s_i$ and/or $PV_i$, and/or read reference voltages, $R_i$, by applying MLE to asymmetrical noise distributions as illustrated in FIGS. 3, 4, and 5. In this implementation, $s_i$, $R_i$, and/or $PV_i$ are determined so that the BER of the LSB pages is about equal to the BER of the MSB pages. The noise distributions for the symbols are estimated 610, e.g., from empirical data and/or from modeling. In some cases, the noise distributions are initially based on empirical characterization data obtained from the memory when the memory is new. The initial noise distributions for the memory may be adjusted over time to account for increasing PE cycles, retention time, $\tau$, and/or disturb effects, $\rho$. These adjusted noise distributions are used to update $s_i$, $R_i$, and/or $PV_i$. Using a maximum likelihood estimation (MLE) $s_i$, $R_i$, and/or $PV_i$ are determined 620 under the constraint that the BER or the MSB pages is about equal to or about equal to the BER of the LSB pages. One or both of a read operation and a program operation is performed using the adjusted $s_i$, $R_i$, and/or $PV_i$ determined using MLE. The memory device is programmed and/or read 630 using the adjusted $R_i$, and/or $PV_i$.

In some implementations, different types of distributions are used for the right and left sides of the noise distribution for each symbol, wherein various distribution types include Gaussian, triangular, exponential or other types. In some cases, the asymmetrical distribution for each symbol may include a first type of distribution for the left side, e.g., corresponding to the LSB bit of the symbol, and a second type of noise distribution on the right side, e.g., corresponding to the MSB bit of the symbol. For example, the asymmetrical distribution could include a Gaussian distribution on the left side and a triangular or exponential distribution on the right side. In some cases, the asymmetrical noise distribution used for each symbol may comprise the same type of distribution on the left and right sides, with the left side distribution having a first set of parameters and the right distribution having a second set of parameters. This situation is illustrated in FIGS. 3, 4, and 5 for the asymmetrical Gaussian, triangular and exponential distributions, respectively.

In some implementations, the type of distribution or distributions used for one symbol is different from the type of distribution or distributions used for another symbol. For example, the noise distribution for symbol 11 may be Gaussian, whereas the noise distribution for symbol 01 may be triangular, and so forth. The distribution types may vary by type and may also vary according to whether the distribution is a right side or left side distribution.

The processes discussed below provide more specific implementation of FIG. 6 for Gaussian, triangular and exponential distributions wherein multipage programming reference voltages are chosen so that the bit error rate (BER) of each page is low, e.g., is the lowest possible. The BER is selected under the constraint that all pages have the same BER or about the same BER. The following specific implementations are for a 2 bit MLC memory (four different levels). The read reference voltages, $R_0$, $R_1$ and $R_2$ and signal levels, $s_1$ and $s_2$, may be determined to minimize the LSB and MSB error probabilities under the constraint that the LSB and MSB have the same error rate. The reference voltage choices also depend on the noise distribution used for the LSB and MSB pages. Note that the upper and lower signal levels, $s_0$ and $s_3$, are assumed to be fixed in these examples.

In a first example of the process of FIG. 6, Gaussian noise distributions as illustrated in FIG. 3 are used to determine optimal reference values. Constants $C_0$, $C_1$, and $K_1$ are determined according to Equations 1-3.

$$C_0 = \left(\frac{\sigma_{2,R} + \sigma_{3,L}}{\sigma_{0,R} + \sigma_{1,L}}\right) \quad [1]$$

$$C_1 = \left(\frac{s_3 + C_0 s_0}{\sigma_{1,R} + \sigma_{2,L}}\right) \quad [2]$$

$$K_1 = \frac{1 + C_0}{\sigma_{1,R} + \sigma_{2,L}} \quad [3]$$

After determining constants $C_0$, $C_1$, and $K_1$, then $s_1$ can be obtained by solving:

$$Q(C_1 - K_1 s_1) = Q\left(\frac{s_1 - s_0}{\sigma_{0,R} + \sigma_{1,L}}\right) \quad [4]$$

where the Q function is:

$$Q(y) = \frac{1}{\sqrt{2\pi}} \int_y^\infty e^{-\frac{x^2}{2}} dx.$$

Equation 4 is a non-linear equation and various numerical techniques, e.g., Newton-Raphson, gradient descent, etc., may be used to solve for $s_1$. Once $s_1$ is calculated, the other reference values, $s_2$, $R_1$, $R_2$, $R_3$ can be calculated according to Equations 5 and 6.

$$s_2 = s_3 - C_0(s_1 - s_0) \quad [5]$$

$$R_i = \frac{s_i \sigma_{i+1,L} + s_{i+1} \sigma_{i,R}}{\sigma_{i,R} + \sigma_{i+1,L}}, i = 0, 1, 2 \quad [6]$$

In a second example, triangular noise distributions as illustrated in FIG. 4 are used to determine optimal reference values. First constants A, B, and $C_i$ are determined according to Equations 7-9.

$$A = \sqrt{\frac{b_{0,R}^2 + b_{1,L}^2}{2(b_{1,R}^2 + b_{2,L}^2)}} \quad [7]$$

$$B = s_0 + s_3 + b_{0,R} + b_{1,L} - b_{2,R} - b_{3,L} \quad [8]$$

$$C_i = b_{i,R} b_{i+1,L} \left(\frac{b_{i+1,L} - b_{i,R}}{b_{i,R}^2 + b_{i+1,L}^2}\right), i = 0, 1, 2 \quad [9]$$

The read reference voltages and signals levels may be determined according to Equations 10-12:

$$s_1 = \frac{s_0 + b_{0,R} + b_{1,L} + A(B - b_{1,R} - b_{2,L})}{1 + 2A} \quad [10]$$

$$s_2 = B - s_1 \quad [11]$$

$$R_i = \frac{s_i b_{i+1,L}^2 + s_{i+1} b_{i,R}^2}{b_{i,R}^2 + b_{i+1,L}^2} + C_i; i = 0, 1, 2 \quad [12]$$

In a third example, exponential noise distributions as illustrated in FIG. 5 are used to determine optimal reference values. Constants $C_i$, and $D_i$ are determined according to Equations 13 and 14.

$$C_i = \left(\frac{\alpha_{i,R}\alpha_{i+1,L}}{\alpha_{i,R} + \alpha_{i+1,L}}\right); i = 0, 1, 2 \quad [13]$$

$$D_i = \ln(\alpha_{i,R} + \alpha_{i+1,L}) - \frac{1}{\alpha_{i,R} + \alpha_{i+1,L}}(\alpha_{i,R}\ln\alpha_{i,R} + \alpha_{i+1,L}\ln\alpha_{i+1,L}); \quad [14]$$
$$i = 0, 1, 2$$

The read reference voltages and signal levels for the exponential case are determined as follows:

$$s_1 = \frac{\ln(2) + s_0 C_0(1 + C_1/2) + s_3 C_1 + D_0(1 + C_1) - D_1 - C_1 D_2}{C_0 + C_1 + C_0 C_1/C_2} \quad [15]$$

$$s_2 = \frac{C_0(s_0 - s_1) + D_0 - D_2}{C_2} + s_3 \quad [16]$$

$$R_i = \frac{\alpha_{i,R} s_i + \alpha_{i+1,L} s_{i+1} + \ln(\alpha_{i,R}/\alpha_{i+1,L})}{\alpha_{i,R} + \alpha_{i+1,L}}; \quad [17]$$
$$i = 0, 1, 2$$

In some cases the read reference voltages, signal levels, and/or program verify voltages are chosen for optimal the average symbol error probability, e.g. to minimize average symbol error probability. The symbol error probability associated with the symbol $s_i$, $P_E(s_i)$, is the probability that the stored symbol is $s_i$ but the symbol that is read is $s_j$, $i \ne j$. The average symbol error probability is obtained by averaging $P_E(s_i)$ over all symbols. This method may be used for full-sequence programming (wherein all bits of a symbol are associated with the same data page) but can also be used for multipage programming (where each of the bits of a symbol are associated with different data page). For the approach outlined below, the BER for the bits that make up a symbol may or may not be equal. For example, with a 2 bit MLC it is possible that the LSB and MSB have different error rates. As with multipage programming, the reference voltage choices depend on the applicable distribution used to model the noise associated with the symbol. In the following examples, a flash with M different symbol levels is assumed.

Figure 7:
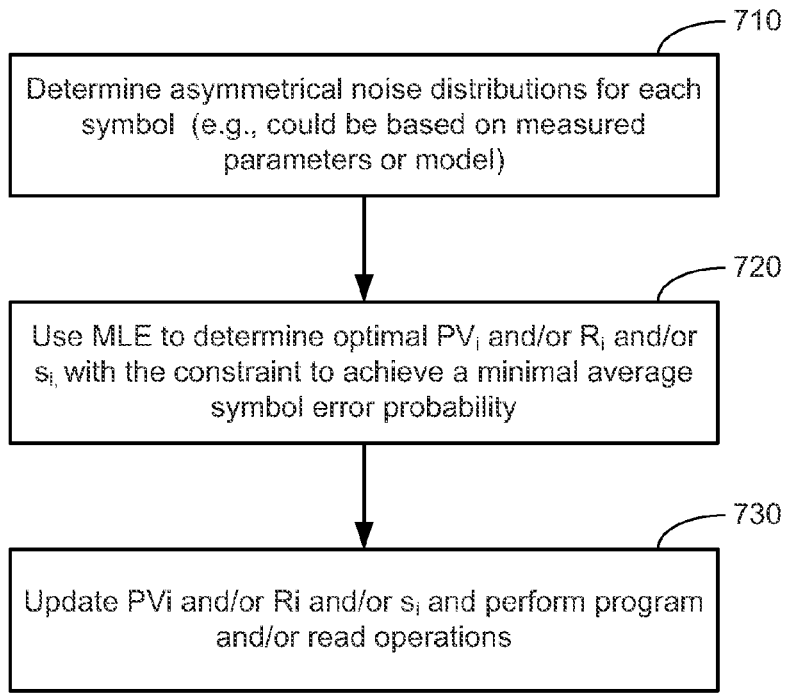
FIG. 7 is a flow diagram illustrating a process of determining optimal signal levels, $s_i$, read reference voltages, $R_i$, and/or program verify voltages $PV_i$, by applying MLE to asymmetrical noise distributions to achieve a minimal average bit error rate for the memory pages in accordance with various embodiments.

FIG. 7 is a flow diagram illustrating a process of determining optimal signal levels, $s_i$, read reference voltages, $R_i$, and/or program verify voltages $PV_i$, by applying MLE to asymmetrical noise distributions as illustrated in FIGS. 3, 4, and 5. In this implementation, $s_i$, $R_i$, and/or $PV_i$, are determined to achieve optimal the average symbol error probability, e.g. to minimize the average symbol error probability. The noise distributions for the symbols are estimated 710, e.g., from empirical data and/or from modeling. In some cases, the noise distributions are initially based on empirical characterization data obtained from the memory when the memory is new. The initial noise distributions for the memory may be adjusted over time to account for increasing PE cycles, PE, retention time, $\tau$, and/or disturb effects, $\rho$. These adjusted noise distributions are used to update $s_i$, $R_i$, and/or $PV_i$. Using a maximum likelihood estimation (MLE) $s_i$, $R_i$, and/or $PV_i$ are determined 720 using the constraint that the optimal (e.g., minimum) average symbol error probability is achieved. One or both of a read operation and a program operation is performed using the adjusted $s_i$, $R_i$, and/or $PV_i$ determined using MLE. The memory device is programmed and/or read 730 using the adjusted programming voltages and read reference voltages.

Figure 8:
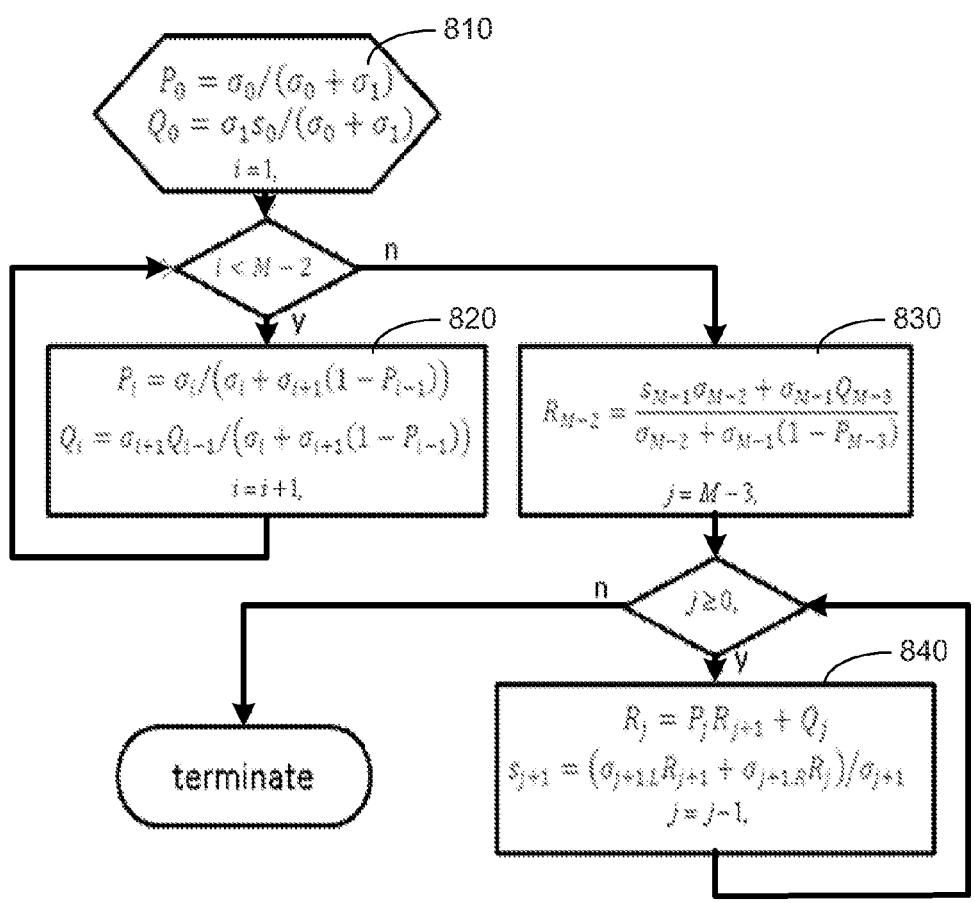
FIG. 8 is a flow diagram that illustrates a process determining programming voltages and read reference voltages for asymmetrical Gaussian noise distributions using a maximum likelihood estimation in accordance with embodiments discussed herein.

In a first example of the process of FIG. 7, Gaussian noise distributions as illustrated in FIG. 3 are used to determine optimal reference values. The flow diagram of FIG. 8 illustrates how $s_i$ and $R_i$ values can be determined. The following notation is used in this example:

$$\sigma_0 = \sigma_{0,R}, \sigma_{M-1} = \sigma_{M-1,L}, \quad [18]$$

$$\sigma_i = \sigma_{i,L} + \sigma_{i,R}, i = 1, \ldots, M-2 \quad [19]$$

Initial constant values $P_0$ and $Q_0$ are determined 810 as:

$$P_0 = \sigma_0/(\sigma_0 + \sigma_1) \quad [20]$$

$$Q_0 = \sigma_1 S_0/(\sigma_0 + \sigma_1) \quad [21]$$

Additional values $P_i$ and $Q_i$ are obtained 820 so long as I<M−2 according to equations 22 and 23, respectively.

$$P_i = \sigma_i/(\sigma_i + \sigma_{i+1}(1 - P_{i-1})) \quad [22]$$

$$Q_i = \sigma_{i+1} Q_{i-1}/(\sigma_i + \sigma_{i+1}(1 - P_{i-1})) \quad [23]$$

Next the M−2 value of the read reference voltage (right most reference) is obtained 830 according to the equation:

$$R_{M-2} = \frac{s_{M-1}\sigma_{M-2} + \sigma_{M-1}Q_{M-3}}{\sigma_{M-2} + \sigma_{M-1}(1 - P_{M-3})} \quad [24]$$

Additional read reference voltages are calculated 840 using the equation:

$$R_j = P_j R_{j+1} + Q_j \quad [25]$$

The signal levels may be calculated 840 based on the read reference values as follows:

$$s_{j+1} = (\sigma_{j+1,L} R_{j+1} + \sigma_{j+1,R} R_j)/\sigma_{j+1} \quad [26]$$

Figure 9:
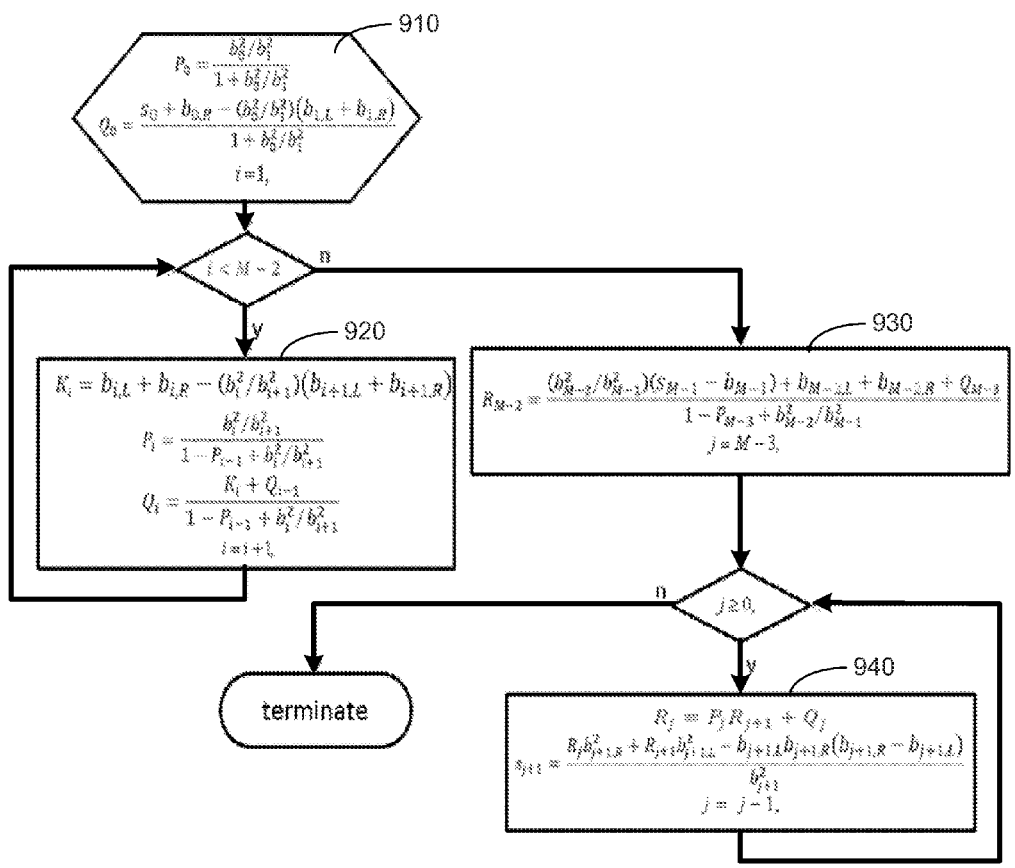
FIG. 9 is a flow diagram that illustrates a process determining programming voltages and read reference voltages for asymmetrical triangular noise distributions using a maximum likelihood estimation in accordance with embodiments discussed herein.

In a second example of the process of FIG. 7, triangular noise distributions as illustrated in FIG. 4 are used to determine optimal reference values. The flow diagram of FIG. 9 illustrates how $s_i$ and $R_i$ values can be determined. The following notation is used in this example:

$$b_0^2 = b_{0,R}, b_{M-1}^2 = b_{M-1,L}^2 \quad [27]$$

$$b_i^2 = b_{i,L}^2 + b_{i,R}^2, i = 1, \ldots, M-2 \quad [28]$$

Initial values $P_0$ and $Q_0$ are determined 910 as:

$$P_0 = \frac{\frac{b_0^2}{b_1^2}}{1 + \frac{b_0^2}{b_1^2}} \quad [29]$$

$$Q_0 = \frac{s_0 + b_{0,R} - \left(\frac{b_0^2}{b_1^2}\right)(b_{1,L} + b_{1,R})}{1 + \frac{b_0^2}{b_1^2}} \quad [30]$$

Additional values $P_i$ and $Q_i$ are obtained 920 so long as i<M−2 according to equations 31 through 33.

$$K_i = b_{i,L} + b_{i,R} - \left(\frac{b_i^2}{b_{i+1}^2}\right)(b_{i+1,L} + b_{i+1,R}) \quad [31]$$

$$P_i = \frac{\frac{b_i^2}{b_{i+1}^2}}{1 - P_{i-1} + \frac{b_i^2}{b_{i+1}^2}} \quad [32]$$

$$Q_i = \frac{K_i + Q_{i-1}}{1 - P_{i-1} + \frac{b_i^2}{b_{i+1}^2}} \quad [33]$$

The right most read reference voltage, $R_{M-2}$, can be calculated 930 based on the highest signal level, $s_{M-1}$:

$$R_{M-2} = \frac{\left(\frac{b_{M-2}^2}{b_{M-1}^2}\right)(s_{M-1} - b_{M-1}) + b_{M-2,L} + b_{M-2,R} + Q_{M-1}}{1 - P_{M-1} + \frac{b_{M-2}^2}{b_{M-1}^2}} \quad [34]$$

Additional read reference voltages are calculated 940 using the equation:

$$R_j = P_j R_{j+1} + Q_j \quad [35]$$

The signal levels may be calculated 940 based on the read reference values as follows:

$$s_{j+1} = R_j b_{j+1,R}^2 + R_{j+1} b_{j+1,L}^2 - b_{j+1,L} b_{j+1,R} (b_{j+1,R} - b_{j+1,L}) / b_{j+1}^2 \quad [36]$$

Figure 10:
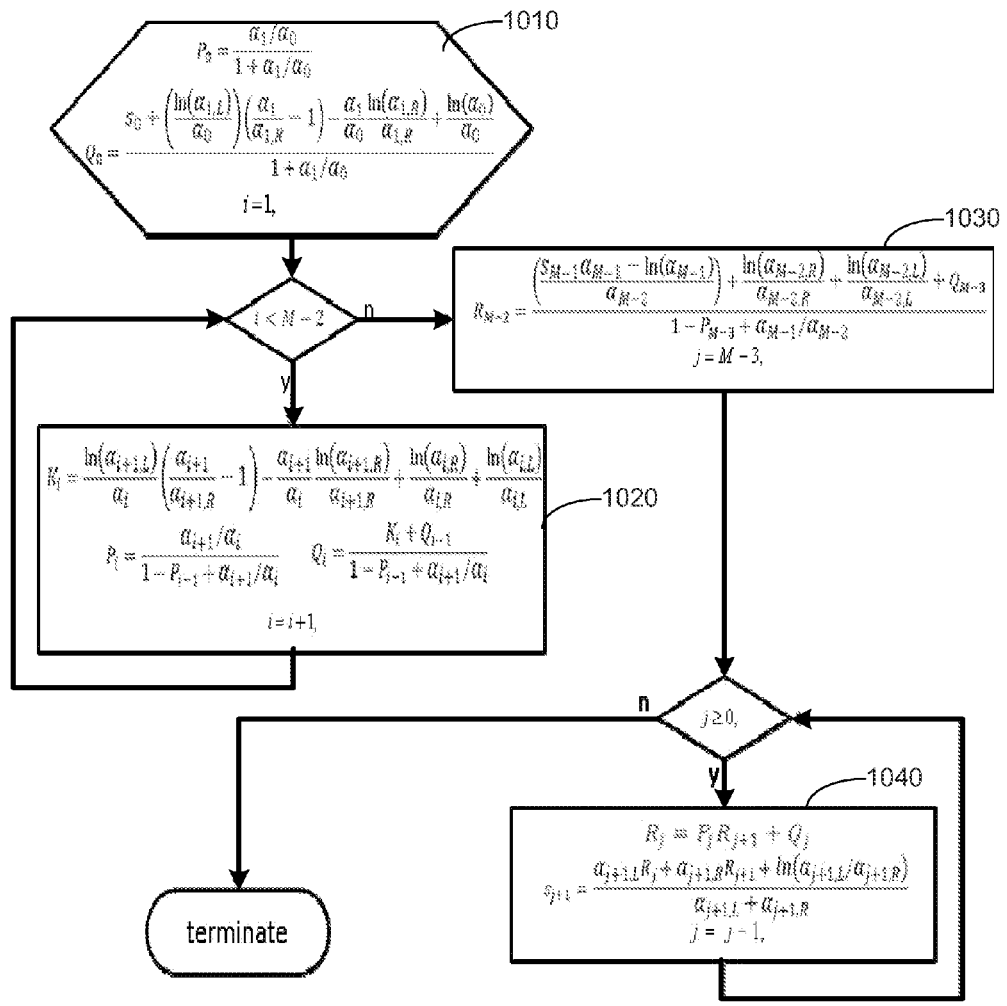
FIG. 10 is a flow diagram that illustrates a process determining programming voltages and read reference voltages for asymmetrical exponential noise distributions using a maximum likelihood estimation in accordance with embodiments discussed herein.

In a third example of the process of FIG. 7, exponential noise distributions as illustrated in FIG. 5 are used to determine optimal reference values. The flow diagram of FIG. 10 illustrates how $s_i$ and $R_i$ values can be determined. The following notation is used in this example:

$$\frac{1}{\alpha_0} = \frac{1}{\alpha_{0,R}}, \frac{1}{\alpha_{M-1}} = \frac{1}{\alpha_{M-1,L}} \quad [37]$$

$$\frac{1}{\alpha_i} = \frac{1}{\alpha_{i,L}} + \frac{1}{\alpha_{i,R}}, i = 1, \ldots, M-2 \quad [38]$$

Initial values $P_0$ and $Q_0$ are determined 1010 as:

$$P_0 = \frac{\frac{\alpha_1}{\alpha_0}}{1 + \frac{\alpha_1}{\alpha_0}} \quad [39]$$

$$Q_0 = \frac{s_0 + \left(\frac{\ln(\alpha_{1,L})}{\alpha_0}\right)\left(\frac{\alpha_1}{\alpha_{1,R}} - 1\right) - \frac{\alpha_1}{\alpha_0}\frac{\ln(\alpha_{1,R})}{\alpha_{1,R}} + \frac{\ln(\alpha_0)}{\alpha_0}}{1 + \frac{\alpha_1}{\alpha_0}} \quad [40]$$

Additional values $P_i$ and $Q_i$ are obtained 1020 so long as i<M−2 according to equations 41 through 43.

$$K_i = \frac{\ln(\alpha_{i+1,L})}{\alpha_i}\left(\frac{\alpha_{i+1}}{\alpha_{i+1,R}} - 1\right) - \frac{\alpha_{i+1}}{\alpha_i}\frac{\ln(\alpha_{i+1,R})}{\alpha_{i+1,R}} + \frac{\ln(\alpha_{i,R})}{\alpha_{i,R}} + \frac{\ln(\alpha_{i,L})}{\alpha_{i,L}} \quad [41]$$

$$P_i = \frac{\frac{\alpha_{i+1}}{\alpha_i}}{1 - P_{i-1} + \frac{\alpha_{i+1}}{\alpha_i}} \quad [42]$$

$$Q_i = \frac{K_i + Q_{i-1}}{1 - P_{i-1} + \frac{\alpha_{i+1}}{\alpha_i}} \quad [43]$$

The right most read reference voltage, $R_{M-2}$, can be calculated 1030 based on the highest signal level, $s_{M-1}$:

$$R_{M-2} = \frac{\frac{s_{M-1}\alpha_{M-1} - \ln(\alpha_{M-1})}{\alpha_{M-2}} + \frac{\ln(\alpha_{M-2,R})}{\alpha_{M-2,R}} + \frac{\ln(\alpha_{M-2,L})}{\alpha_{M-2,L}} + Q_{M-1}}{1 - P_M + \frac{\alpha_{M-1}}{\alpha_{M-2}}} \quad [44]$$

Additional read reference voltages are calculated 1040 using the equation:

$$R_j = P_j R_{j+1} + Q_j \quad [45]$$

The signal levels may be calculated 1040 based on the read reference values as follows:

$$s_{j+1} = \frac{\alpha_{j+1,L} R_j + \alpha_{j+1,R} R_{j+1} + \ln\left(\frac{\alpha_{j+1,L}}{\alpha_{j+1,R}}\right)}{\alpha_{j+1,L} + \alpha_{j+1,R}} \quad [46]$$

Figure 11:
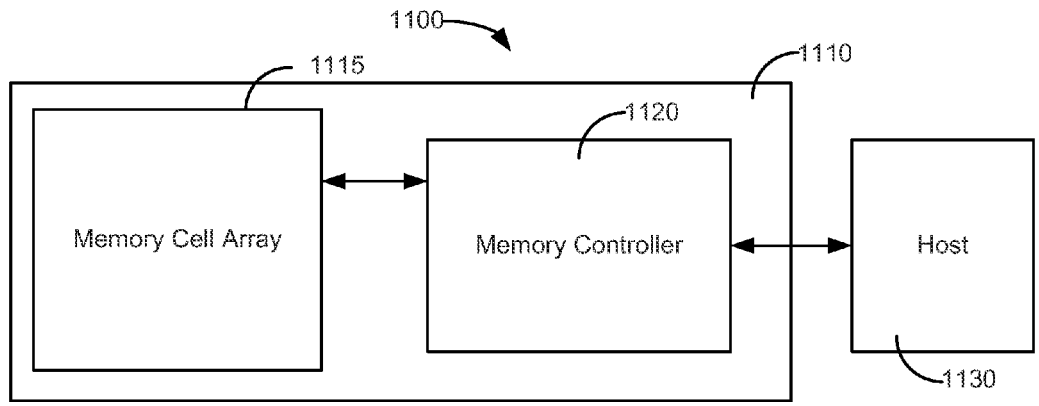
FIG. 11 is a block diagram of a system capable of storing data in memory cells and later retrieving the data including adjusting one or more of programming and reference voltages using a maximum likelihood estimation according to approaches described herein.

FIG. 11 is a block diagram of a system 1100 capable of storing data in memory cells and later retrieving the data including adjusting one or more of $s_i$, $PV_i$, and $R_i$ using a maximum likelihood estimation (MLE) according to approaches described herein. The system 1100 includes a memory device 1110 in communication with a host processor 1130. The memory device 1110 comprises a memory cell array 1115 and a memory controller 1120. The memory controller 1120 is configured to control the operation of the memory array 1115 and to provide an interface between the memory array 1115 and the host 1130. The block diagram of FIG. 11 and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, in some implementations, all or a portion of the functionality of the memory controller 1120 may be included within the host 1130. The various approaches described herein may be implemented using hardware, software, or a combination of hardware and software, for example.

As previously discussed, the data stored in each memory cell of the memory array 1115 is represented as an analog voltage according to the amount of charge stored in the memory cell. The analog voltages of each memory cell can be converted to a digital format corresponding to a symbol comprising one or more data bits stored in the memory cell. Programming data to a memory cell involves a sequence of steps that include charging the memory cell and verifying whether the memory cell is sufficiently charged so that the analog voltage of the memory cell has surpassed a program verify voltage ($PV_i$) corresponding to the data symbol to be stored. Reading the data stored in the memory cell involves sensing the analog voltage of the memory cell and comparing the analog voltage to one or more read reference voltages.

The memory array 1115 comprises detector circuitry including voltage sense and comparator circuitry configured to sense the analog voltages of the memory cells of the memory array 1115 to effect read operations. The detector circuitry compares the sensed voltages of the memory cells to reference voltages and outputs an indication of the digital symbols stored in the memory cells based on the comparisons. The memory array 1115 also includes write circuitry configured to generate signals to implement programming operations of the memory 1115.

Figure 12:
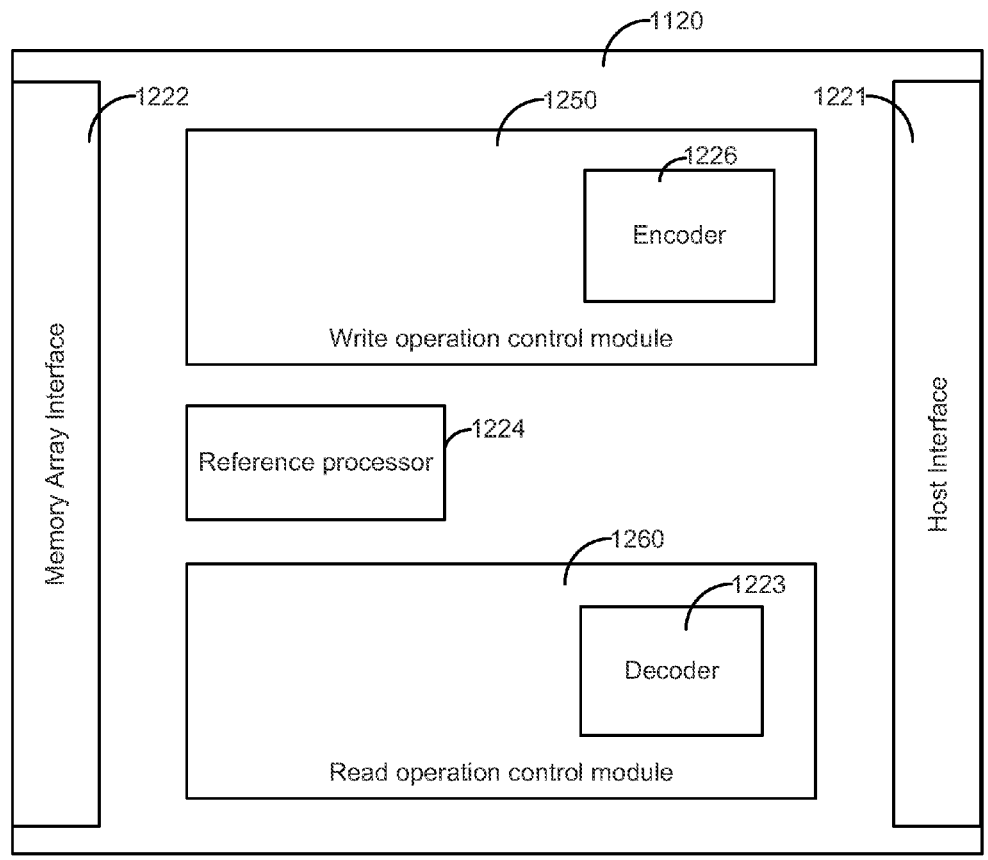
FIG. 12 provides a more detailed view of the controller of FIG. 11, including a reference processor in accordance with embodiments discussed herein.

FIG. 12 illustrates the memory controller 1120 in more detail. A host interface 1221 facilitates the transfer of data and control signals between the memory controller 1120 and the host 1130. A write operation control module 1250 controls certain write operations involving transfer of data from the host 1130 through the memory controller 1120 and then to the memory 1115 for storage. Prior to storage of the data in memory 1115, the data may be encoded by the encoder circuitry 1226 using an error correcting code (ECC). The encoded data is then transferred via the memory array interface 1222 from the controller 1120 to the memory 1115 and is programmed into the memory cells of the memory 1115.

A read operation control module 1260 controls certain read operations involving the transfer of data from the memory 1115 through the memory controller 1120 and then to the host 1130. For example, if the host 1130 requests retrieval of the stored data in the memory 1115, the encoded data is read from the memory 1115 and is decoded by decoder circuitry 1223 using the ECC. The decoded data is transferred to the host 1130 via the host interface 1221. The decoder 1223 uses the ECC to attempt to identify and/or correct errors that are present in the data read from the memory 1115. The data errors may arise, for example, due to data corruption caused by charge leakage and/or disturb effects as mentioned above.

The controller 1120 includes a reference voltage processor 1224 which may be configured to implement various processes related to determining read reference and/or programming voltages used to read and/or program the memory 1115 as described herein. For example, the reference processor 1224 may be configured to implement the processes described in connection with the flow diagrams of FIGS. 2, 6A, 6B, and 7-10 and/or may be configured to determine read reference and programming voltages using noise distributions such as those illustrated in FIGS. 3-5.

In various implementations, the reference processor 1224 is configured to determine noise statistics for some arbitrary PE cycle number, retention time, $\tau$, read disturb, type of page, e.g., MSB or LSB, page number, and/or other parameters. The reference processor can be configured to determine noise statistics from the measured bit error rate BER which can be obtained during the decoding process, for example. In some cases, the reference processor determines the noise statistics for the symbols through bucket classification of errors as described in previously incorporated U.S. patent application Ser. No. 13/275,418.

As discussed above, the reference processor 1224 may be configured to obtain noise statistics at some arbitrary retention time, $\tau_a$. The parameter values used to estimate the noise statistics may comprise bit error rate (BER), which may be a function of retention time, number of PE cycles, read disturb events, temperature of the device, page number, page type, and/or other such parameters.

The reference processor 1224 estimates noise statistics so that the BER for retention interval, $\tau_{write}$, such as a maximum retention interval $\tau_{max}$, is acceptable or optimal. The noise estimations account for noise factors that may affect the data stored in the cells during the interval $\tau_{write}$ which is the interval of time between the time that data is written to the cells and the time that the data is read from the cells. In some cases, the reference processor may estimate the noise statistics based on empirical data, e.g., characterization of the device parameters at some retention time $\tau$. In some cases, the reference processor estimates the noise statistics based on a model that provides an estimation of the extent to which PE, $\tau$, $\rho$ and/or other factors would alter the charge stored in the memory cells during the retention interval $\tau_{write}$. In some cases, the reference processor estimates the noise statistics based on both the empirical data and the model.

The reference processor may also estimate noise statistics for determining read reference voltages. As before, whereas a noise statistics may be initially obtained after some arbitrary time interval, $\tau_a$, the noise statistics may be estimated for a subsequent time interval, $\tau_{read}$. Adjusting the read reference voltages, $R_i$ using the noise statistics estimated for interval $\tau_{read}$ could improve the BER of a subsequent read operation because the adjusted read reference voltages compensate for changes in the charge stored in the cells due to charge leakage and/or disturb effects. As before, the noise statistics may be estimated based on empirical data (noise parameters obtained at any time) and/or on modeling.

The noise statistics estimated for $\tau_{write}$ and/or $\tau_{read}$ may be characterized by symmetrical or asymmetrical noise distributions, such as the asymmetrical noise distributions shown in FIGS. 3-5. The reference processor 1224 may adjust one or more of the read reference voltages, $R_i$ and/or the programming voltages e.g., program verify levels, $PV_i$ and/or target signal levels, using the noise distributions.

In various embodiments, the reference processor 1224 may be configured to perform joint determination of the read reference voltages, Ri, and program verify levels, $PV_i$ using MLE and/or asymmetrical noise distributions as described above. In multipage implementations cases, the reference processor may determine the reference voltages so that the BERs for the MSB pages and LSB pages are the same or are about the same. In multipage or full sequence implementations, the reference processor 1224 may determine the reference voltages so that all pages on an average have a relatively low BER. In some configurations, the reference processor may use asymmetrical noise distributions as illustrated in FIGS. 3-4 to determine the signal levels, $s_i$, read reference voltages, $R_i$, and program verify levels, $PV_i$. For example, the reference processor may determine the signal levels, $s_i$, read reference voltages, $R_i$, and program verify levels, $PV_i$ by implementing equations 1-46.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. A method of operating a memory device, comprising:
using symmetrical or asymmetrical noise distributions for voltages corresponding to symbols that can be stored in multi-level memory cells (MLCs) of the memory device;
determining at least one of read reference voltages and programming voltages for the MLCs including:
jointly determining the read reference voltages and programming voltages using the symmetrical distributions and a maximum likelihood estimation (MLE); and
determining at least one of the read reference voltages and the programming voltages using the asymmetrical distributions; and
performing at least one of programming the MLCs using the programming voltages and reading the MLCs using the read reference voltages.

2. The method of claim 1, wherein jointly determining the noise distributions comprises determining at least one noise distribution comprising a first noise distribution for voltages above target signal level and a second noise distribution, different from the first noise distribution, for voltages below the target signal level.

3. The method of claim 1, wherein:
the MLCs are arranged as a physical page of the memory device and the MLCs are configured to store a least significant bit (LSB) page and most significant bit (MSB) page in the physical page, the LSB page comprising LSBs of the MLCs and a the MSB page comprising MSBs of the MLCs page; and
jointly determining the read reference voltages and programming voltages for the MLCs using the noise distributions comprises determining the read reference and programming voltages so that a bit error rate of the MSB page and a bit error rate of the LSB page are about equal.

4. The method of claim 1, wherein:
the MLCs are arranged as a physical page of the memory device; and
jointly determining the read reference and programming voltages for the MLCs using the noise distributions comprises determining the read reference voltages to achieve a minimal average bit error rate.

5. The method of claim 4, wherein the memory device is configured to store a single page of data in the physical page.

6. The method of claim 4, wherein the memory device is configured to store a least significant bit (LSB) page comprising LSBs of the MLCs and a most significant bit (MSB) page comprising MSBs of the MLCs in the physical page.

7. A method of operating a memory device, comprising:
using noise distributions for voltages corresponding to symbols that can be stored in multi-level memory cells (MLCs) of the memory device, each noise distribution comprising a first noise distribution for voltages above a target signal value and a second noise distribution, different from the first noise distribution, for voltages below the target signal value;
determining at least one of read reference voltages and programming voltages for the MLCs using the first and second noise distributions; and
performing at least one of programming the MLCs using the programming voltages and reading the MLCs using the read reference voltages,
wherein the first and second noise distributions comprise at least one of:
1) the first noise distribution comprises a first Gaussian noise distribution having a first standard deviation, $\sigma_1$, and the second noise distribution comprises a second Gaussian noise distribution having a second standard deviation, $\sigma_2$, where $\sigma_1 \neq \sigma_2$,
2) the first noise distribution comprises a first triangular noise distribution having a first base, $b_1$, and the second noise distribution comprises a second triangular noise distribution having a second base, $b_2$, where $b_1 \neq b_2$, and
3) the first noise distribution comprises a first exponential noise distribution having a first rate of change, a1 and the second noise distribution comprises a second exponential noise distribution having a second rate of change, $\alpha_2$, where $\alpha_1 \neq \alpha_2$.

8. The method of claim 7, wherein:
the MLCs are arranged as a physical page of the memory device and the memory device is configured to store a least significant bit (LSB) page comprising LSBs of the MLCs and a most significant bit (MSB) page comprising MSBs of the MLCs in the physical page; and
determining at least one of read reference voltages and programming voltages for the MLCs using the first and second noise distributions comprises determining at least one of read reference voltages and programming voltages so that a bit error rate of the MSB page and a bit error rate of the LSB page are about equal.

9. The method of claim 7, wherein:
the MLCs are arranged as a physical page of the memory device; and
determining at least one of read reference voltages and programming voltages for the MLCs using the first and second noise distributions comprises at least one of read reference voltages and programming voltages to achieve a minimal average bit error rate.

10. The method of claim 7, wherein the first noise distribution comprises a first type of distribution function and the second noise distribution comprises a second type of distribution function, different from the first type of distribution function.

11. An apparatus, comprising:
a controller capable of being coupled to a memory device, the controller configured to
use symmetrical or asymmetrical noise distributions for symbols corresponding to voltage levels capable of being stored in multi-level memory cells (MLCs) of the memory device; and
jointly determine read reference voltages and programming voltages for the MLCs using the symmetrical noise distributions and a maximum likelihood estimation or determine at least one of the read reference voltages and the programming voltages using the symmetrical or the asymmetrical distributions.

12. The apparatus of claim 11, wherein each of the asymmetrical noise distributions includes first and second noise distributions comprising at least one of:
a first Gaussian noise distribution having a first standard deviation, $\sigma_1$, and a second the second Gaussian noise distribution having a second standard deviation, $\sigma_2$, where $\sigma_1 \neq \sigma_2$;
a first triangular noise distribution having a first base, $b_1$, and a second triangular noise distribution having a second base, $b_2$, where $b_1 \neq b_2$; and
a first exponential noise distribution having a first rate of change, α1 and second exponential noise distribution having a second rate of change, $\alpha_2$, where $\alpha_1 \neq \alpha_2$.

13. The apparatus of claim 11, wherein:
the MLCs are arranged as a physical page of the memory device, the physical page configured to store a least significant bit (LSB) page comprising LSBs of the MLCs and a most significant bit (MSB) page comprising MSBs of the MLCs in the physical page; and the controller is configured to determine at least one of the read reference voltages and programming voltages for the MLCs using the first and second noise distribution functions so that a bit error rate of the MSB page and a bit error rate of the LSB page are about equal.

14. The apparatus of claim 13, wherein the MLCs are arranged as a physical page of the memory device, the physical page is configured to store a single data page.

15. The apparatus of claim 13, wherein the controller is configured to determine at least one of the read reference voltages and programming voltages to achieve a minimal average bit error rate.

16. The apparatus of claim 13, wherein the MLCs are arranged as a physical page of the memory device, the physical page is configured to store more than one data page.

17. The apparatus of claim 13, wherein the more than one data page comprises a most significant bit (MSB) page and a least significant bit (LSB) page and the controller is configured to determine at least one of the read reference voltages and programming voltages to achieve equal or about equal bit error rate of the MSB page and the LSB page.

* * * * *

UNITED STATES PATENT AND TRADEMARK OFFICE
CERTIFICATE OF CORRECTION

PATENT NO. : 8,760,932 B2
APPLICATION NO. : 13/275497
DATED : June 24, 2014
INVENTOR(S) : Arvind Sridharan and Ara Patapoutian It is certified that error appears in the above-identified patent and that said Letters Patent is hereby corrected as shown below:

In the Claims

Column 18, line 10, Claim 7: "noise distribution having a first rate of change, a1" should read --noise distribution having a first rate of change, $\alpha 1$--.

Signed and Sealed this
Fourth Day of November, 2014

Michelle K. Lee
*Deputy Director of the United States Patent and Trademark Office*